US011572625B2

(12) United States Patent
Kobayashi et al.

(10) Patent No.: US 11,572,625 B2
(45) Date of Patent: Feb. 7, 2023

(54) ROTATION DETECTION JIG, SUBSTRATE PROCESSING APPARATUS AND METHOD OF OPERATING THE SUBSTRATE PROCESSING APPARATUS

(71) Applicant: TOKYO ELECTRON LIMITED, Tokyo (JP)

(72) Inventors: Takeshi Kobayashi, Oshu (JP); Hitoshi Kato, Oshu (JP); Yukio Ohizumi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 825 days.

(21) Appl. No.: 15/900,836

(22) Filed: Feb. 21, 2018

(65) Prior Publication Data

US 2018/0251892 A1  Sep. 6, 2018

(30) Foreign Application Priority Data

Mar. 1, 2017  (JP) .............................. JP2017-038740

(51) Int. Cl.
*C23C 16/458* (2006.01)
*C23C 16/455* (2006.01)
(Continued)

(52) U.S. Cl.
CPC .... *C23C 16/4584* (2013.01); *C23C 16/45544* (2013.01); *H01L 21/68764* (2013.01); *C23C 16/402* (2013.01)

(58) Field of Classification Search
None
See application file for complete search history.

(56) References Cited

U.S. PATENT DOCUMENTS

2006/0144335 A1\* 7/2006 Lee .......................... C23C 16/52
156/345.24
2008/0142733 A1\* 6/2008 Zywno .............. H01L 21/68771
250/491.1
(Continued)

FOREIGN PATENT DOCUMENTS

CN       1011621555 A    4/2008
CN       105568259 A     5/2016
(Continued)

*Primary Examiner* — Jeffrie R Lund
*Assistant Examiner* — Tiffany Z Nuckols
(74) *Attorney, Agent, or Firm* — Nath, Goldberg & Meyer; Jerald L. Meyer; Tanya E. Harkins

(57) ABSTRACT

There is provided a rotation detection jig used for an apparatus in which a substrate is processed inside a processing container by rotating a mounting stand for a substrate provided on one surface side of a rotary table while revolving the mounting stand with rotation of the rotary table, and supplying a processing gas to a region through which the mounting stand passes, including: a rotating element configured to rotate about a rotation shaft of the mounting stand; an encoder main body configured to detect a rotation angle of the rotating element and configured to constitute a rotary encoder together with the rotating element; a fixing member configured to fix the encoder main body to a rotating portion including the rotary table; and a signal processing part provided in the rotating portion and configured to process a detection signal detected by the encoder main body.

7 Claims, 17 Drawing Sheets

(51) Int. Cl.
    *H01L 21/687*     (2006.01)
    *C23C 16/40*     (2006.01)

(56) References Cited

U.S. PATENT DOCUMENTS

| | | |
|---|---|---|
| 2010/0258432 A1 | 10/2010 | Ernult |
| 2012/0075460 A1* | 3/2012 | Aikawa ............ C23C 16/45551 340/686.4 |
| 2012/0118504 A1* | 5/2012 | Nomura ............ H01L 21/68792 156/345.28 |
| 2016/0122872 A1* | 5/2016 | Kato ................ H01L 21/68764 118/712 |
| 2016/0138159 A1* | 5/2016 | Kato ................ C23C 16/45551 118/730 |
| 2016/0223712 A1* | 8/2016 | Price ...................... G01N 21/27 |
| 2017/0067160 A1* | 3/2017 | Kato .................... C23C 16/402 |
| 2017/0218514 A1* | 8/2017 | Kato ................ H01J 37/32779 |

FOREIGN PATENT DOCUMENTS

| | | | |
|---|---|---|---|
| CN | 105603391 | A | 5/2016 |
| JP | 2013-174020 | A | 9/2013 |
| JP | 2016-92156 | A | 5/2016 |
| JP | 2016-96220 | A | 5/2016 |
| KR | 10-2016-0051650 | A | 5/2016 |
| KR | 10-2016-0057322 | A | 5/2016 |
| TW | 201705354 | A | 2/2017 |

\* cited by examiner

US 11,572,625 B2

ROTATION DETECTION JIG, SUBSTRATE PROCESSING APPARATUS AND METHOD OF OPERATING THE SUBSTRATE PROCESSING APPARATUS

CROSS-REFERENCE TO RELATED APPLICATION

This application is based upon and claims the benefit of priority from Japanese Patent Application No. 2017-038740, filed on Mar. 1, 2017, the entire contents of which are incorporated herein by reference.

TECHNICAL FIELD

The present disclosure relates to a technique for detecting a rotation amount of a mounting stand in an apparatus in which a substrate is processed by rotating the mounting stand provided on one surface side of a rotary table while revolving the mounting stand, and supplying a processing gas to the substrate.

BACKGROUND

In a manufacturing process of a semiconductor device, for example, ALD (Atomic Layer Deposition) is performed when forming a film on a semiconductor wafer (hereinafter referred to as a wafer) which is a substrate. In order to increase the productivity of the semiconductor device, the aforementioned ALD may be performed by an apparatus in which a plurality of wafers is revolved by rotating a rotary table having the wafers mounted thereon and is caused to repeatedly pass through a processing gas supply region disposed to extend along the radial direction of the rotary table.

Moreover, in an etching process performed as a post process of a film forming process, there may be a case where an etching rate can be adjusted concentrically. Therefore, in the film forming process, film formation must be performed on a wafer with concentrically high uniformity, namely with high uniformity in the circumferential direction of the wafer. However, in the film forming apparatus for revolving the wafer, a processing gas is supplied along the radial direction of a rotary table. Therefore, the film thickness distribution formed on the wafer tends to become a film thickness distribution in which the film thickness is changed from the center side toward the periphery side of the rotary table. Accordingly, in the aforementioned film forming apparatus, it is necessary to rotate the wafer while revolving the same.

For example, techniques have been proposed in which, in a film forming apparatus that revolves a wafer during a film forming process, uniform film formation is performed along the circumferential direction of the wafer by rotating the wafer mounted on a rotary table on its own axis. One of the techniques uses a first gear and a second gear and rotates the second gear with a motor to rotate the wafer on its own axis. However, particles may be generated due to the contact between the first gear and the second gear. In another technique, the rotation of the wafer is performed by rotating a rotation shaft provided in a wafer mounting region with a motor. Therefore, when a plurality of mounting regions is provided in the rotary table, control becomes complicated as the number of motors increases.

Under these circumstances, the present inventors have been studying a technique of using a magnetic gear mechanism to rotate a mounting stand through a magnetic force in a non-contact manner. A method capable of accurately and easily detecting the rotation amount of the mounting stand is needed.

SUMMARY

Some embodiments of the present disclosure provide a technique capable of detecting a rotation amount of a mounting stand when substrate processing is performed by rotating a mounting stand for a substrate provided on one surface side of a rotary table while revolving the mounting stand, and supplying a processing gas to the substrate.

According to one embodiment of the present disclosure, there is provided a rotation detection jig used for an apparatus in which a substrate is processed inside a processing container by rotating a mounting stand for a substrate provided on one surface side of a rotary table while revolving the mounting stand with rotation of the rotary table, and supplying a processing gas to a region through which the mounting stand passes, including: a rotating element configured to rotate about a rotation shaft of the mounting stand; an encoder main body configured to detect a rotation angle of the rotating element and configured to constitute a rotary encoder together with the rotating element; a fixing member configured to fix the encoder main body to a rotating portion including the rotary table; and a signal processing part provided in the rotating portion and configured to process a detection signal detected by the encoder main body.

According to another embodiment of the present disclosure, there is provided a substrate processing apparatus in which a substrate is processed inside a processing container by rotating a mounting stand for a substrate provided on one surface side of a rotary table while revolving the mounting stand with rotation of the rotary table, and supplying a processing gas to a region through which the mounting stand passes, including: a rotation shaft rotatably provided in a portion rotating together with the rotary table and configured to support the mounting stand; a driven gear provided on the rotation shaft; a driving gear provided so as to face a revolution trajectory of the driven gear and configured to constitute a magnetic gear mechanism together with the driven gear; a rotating element provided so as to rotate about the rotation shaft of the mounting stand; an encoder main body configured to detect a rotation angle of the rotating element and configured to constitute a rotary encoder together with the rotating element; a fixing member configured to fix the encoder main body to a rotating portion including the rotary table; and a signal processing part provided in the rotating portion and configured to process a detection signal detected by the encoder main body.

According to another embodiment of the present disclosure, there is provided a method for operating a substrate processing apparatus in which a substrate is processed inside a processing container by rotating a mounting stand for a substrate provided on one surface side of a rotary table while revolving the mounting stand with rotation of the rotary table, and supplying a processing gas to a region through which the mounting stand passes, the method including: rotating a driven gear by operating a driving gear, the driven gear provided on a rotation shaft of the mounting stand, the driving gear provided so as to face a revolution trajectory of the driven gear and configured to constitute a magnetic gear mechanism together with the driven gear; and detecting a rotation angle of the driven gear using an encoder main body constituting a rotary encoder together with a rotating element provided so as to rotate about the rotation shaft.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present disclosure is directed to a technique for detecting a rotation amount of a mounting stand in an apparatus in which a substrate is processed by rotating the mounting stand for substrates provided on one surface side of a rotary table while revolving the mounting stand, and supplying a processing gas to a region through which the mounting stand passes. The rotation amount of the mounting stand is detected by detecting a rotation angle of the mounting stand using an encoder main body constituting a rotary encoder together with a rotating element provided so as to rotate about a rotation axis of the mounting stand. Hereinafter, a configuration including a mechanism for detecting the rotation amount of the mounting stand will be described in detail.

Figure 1:
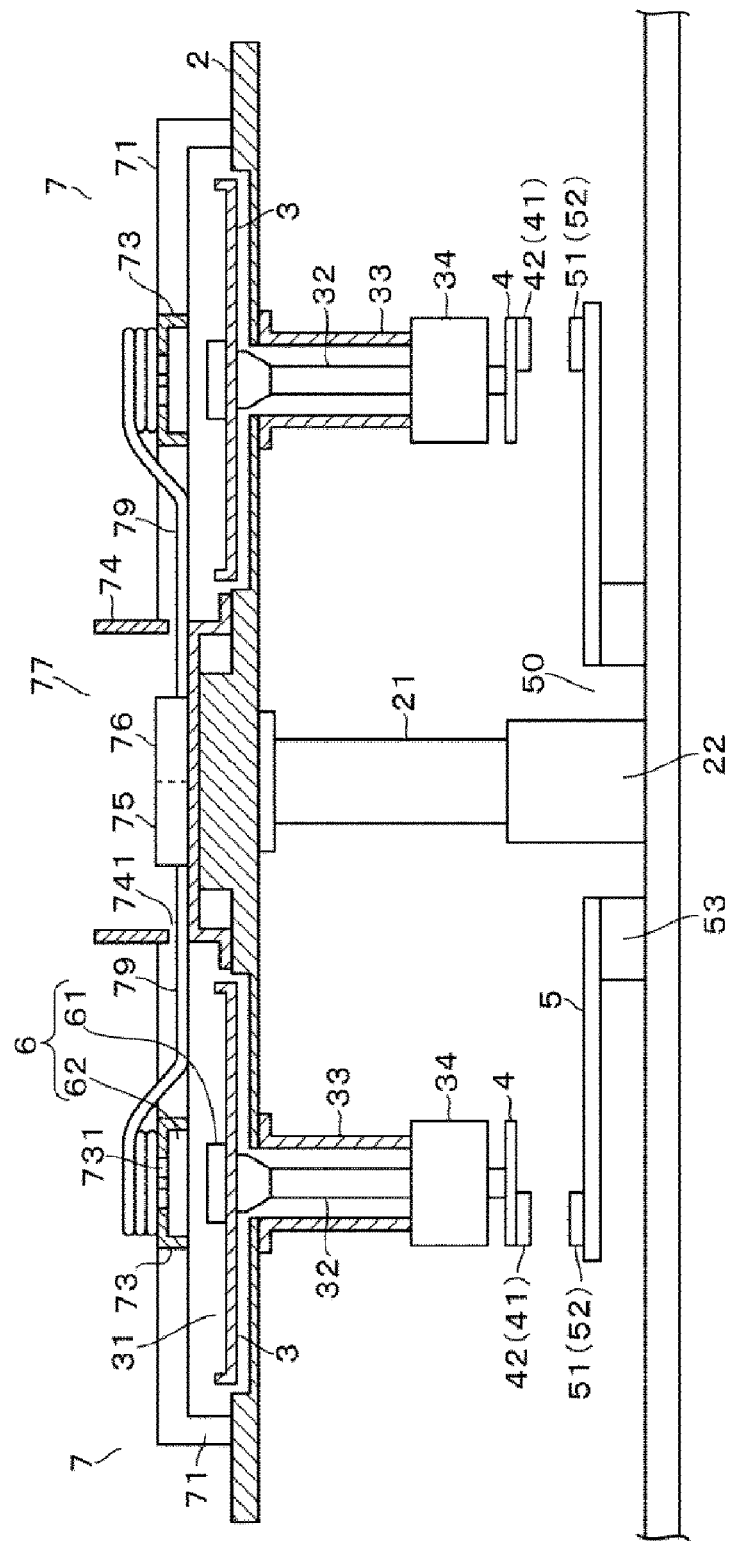
FIG. 1 is a vertical sectional side view showing one embodiment of a rotary table provided with a rotation detection jig according to the present disclosure.
Figure 2:
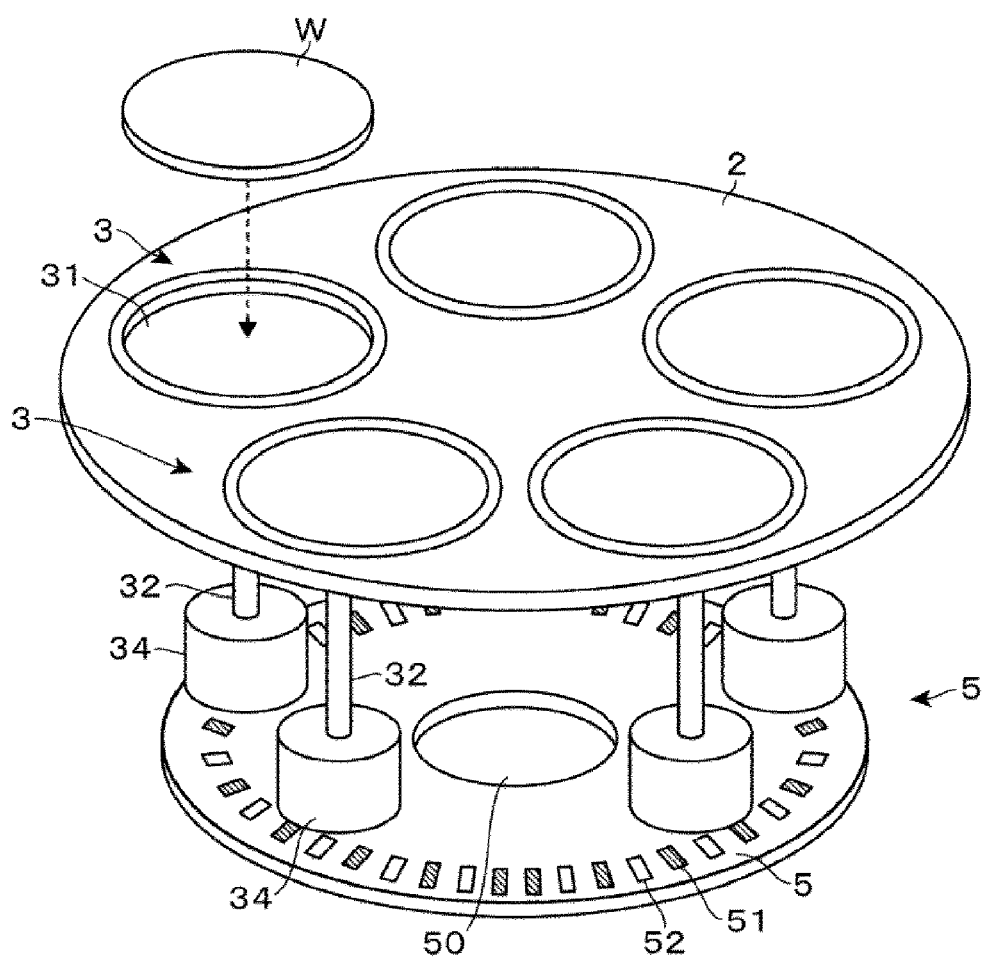
FIG. 2 is a schematic perspective view of a rotary table.

One embodiment of a rotation detection jig used for detecting a rotation amount of a mounting stand will be described with reference to FIGS. 1 to 6. FIG. FIG. 1 is a vertical sectional side view showing a state in which the rotation detection jig is attached to a rotary table in the apparatus. The structure of a rotary table 2 will be described with reference to FIGS. 1 to 4. FIG. 2 schematically shows the main part of the rotary table 2 before the rotation detection jig is attached. A rotary shaft 21 extending vertically downward is connected to the central portion of the rotary table 2. The rotary shaft 21 is connected to a revolution-purpose rotating mechanism 22. By rotating the rotary shaft 21 using the revolution-purpose rotating mechanism 22, the rotary table 2 rotates, for example, clockwise, when viewed from the upper surface side.

Mounting stand 3 is located on the upper surface side (one surface side) of the rotary table 2, and revolve with the rotation of the rotary table 2. The mounting stands 3 are formed in a circular planar shape. For example, five mounting stands 3 are provided along the rotational direction of the rotary table 2. A recess 31 is formed in the upper surface of each of the mounting stands 3. A wafer W used as a substrate is horizontally accommodated in the recess 31. Alternatively, six mounting stands 3 may be provided in the rotary table 2.

In the central portion of the lower surface side of each mounting stand 3, a rotation shaft 32 supporting the respective mounting stand 3 is provided so as to extend vertically downward. The rotation shaft 32 is supported by, for example, a bearing unit 34 fixed to the lower surface of the rotary table 2 via a cylindrical body 33. Therefore, the rotation shaft 32 is provided so as to be able to rotate together with the rotary table 2. The mounting stand 3 is configured so that it can be revolved with the rotation of the rotary table 2. The bearing unit 34 includes a bearing (not shown) for rotatably holding the rotation shaft 32 and a magnetic seal (not shown) for preventing scattering of particles from the bearing. The lower portion of the rotation shaft 32 penetrates the bearing unit 34. A driven gear 4 is provided at the lower end portion of the rotation shaft 32.

Figure 3:
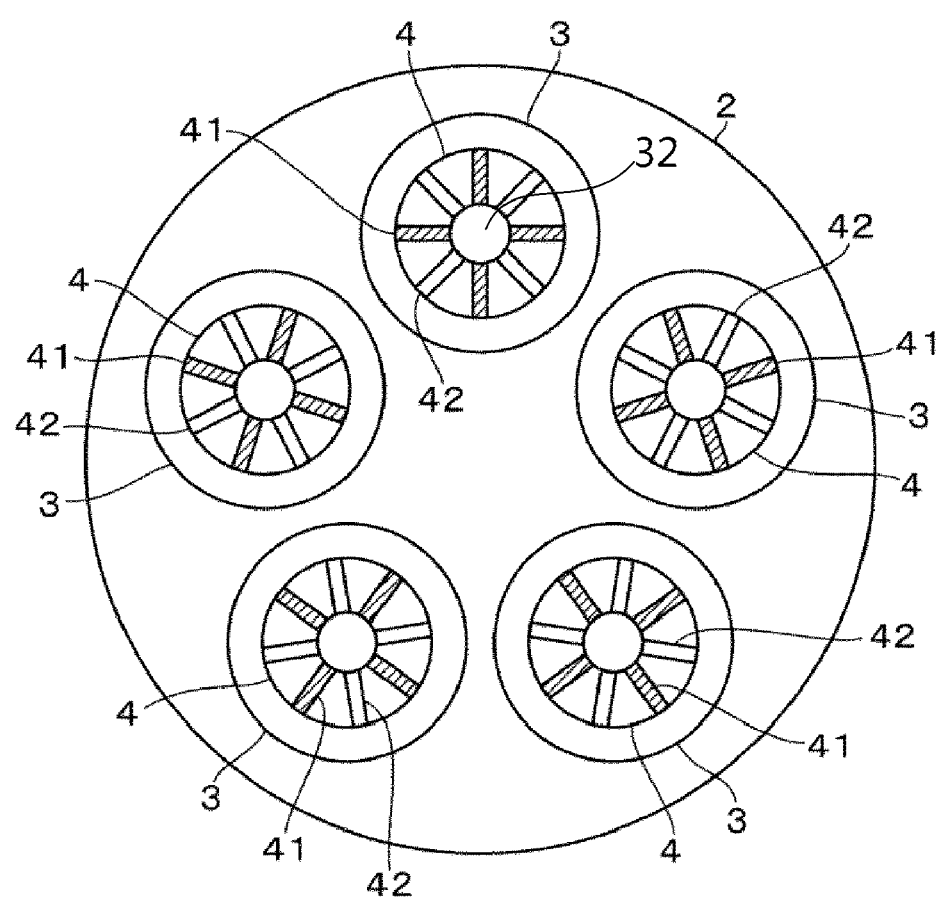
FIG. 3 is a bottom view schematically showing driven gears provided in a lower surface of a mounting stand.

FIG. 3 is a view showing driven gears 4 when viewed from the lower surface side. In FIG. 3, the driven gears 4 are schematically shown. Each of the driven gears 4 is formed in a disk shape and is connected to the rotation shaft 32 in a state in which the central axes of the driven gears 4 are aligned with the central axes of the rotation shaft 32, respectively. Therefore, the driven gear 4 is connected to the mounting stand 3 via the rotation shaft 32. The driven gear 4 is revolved with the rotation of the rotary table 2. Since the bearing unit 34 rotatably holds the rotation shaft 32, when the driven gear 4 is rotated in the circumferential direction, each mounting stand 3 rotates about its own rotation axis.

On the lower surface of the driven gear 4, N-pole portions 41 and S-pole portions 42, which are magnetic pole portions made of permanent magnets, are alternately arranged along the rotational direction. The N-pole portions 41 are indicated by hatching so as to distinguish them from the S-pole portions 42. In this example, for example, twenty N-pole portions 41 and twenty S-pole portions 42 exposed on the lower surfaces of the driven gears 4 are formed in the same strip shape and are arranged at intervals in the circumferential direction so as to radially extend in the lateral direction from the central portion of the lower surface of each of the driven gears 4. For example, the length of the N-pole portions 41 and the S-pole portions 42 is set shorter than the radius of the driven gear 4 so as not to exceed the center of the bottom surface of the driven gear 4.

As shown in FIGS. 1 and 2, a driving gear 5 is disposed below the driven gears 4. The driving gear 5, which constitutes a magnetic gear mechanism together with the driven gears 4, is provided along the entire revolution trajectory of the driven gears 4 so as to face the revolution trajectory of the driven gears 4. The driving gear 5 of this example is an annular plate-like member having a circular opening 50 formed in the central portion thereof. The center of the opening 50 of the driving gear 5 is disposed so as to be aligned with the rotation center of the rotary table 2. N-pole portions 51 and S-pole portions 52, which are magnetic pole portions made of permanent magnets, are alternately arranged on the upper surface of the driving gear 5 along the revolution trajectory of the driven gears 4 over the entire circumference.

Figure 4:
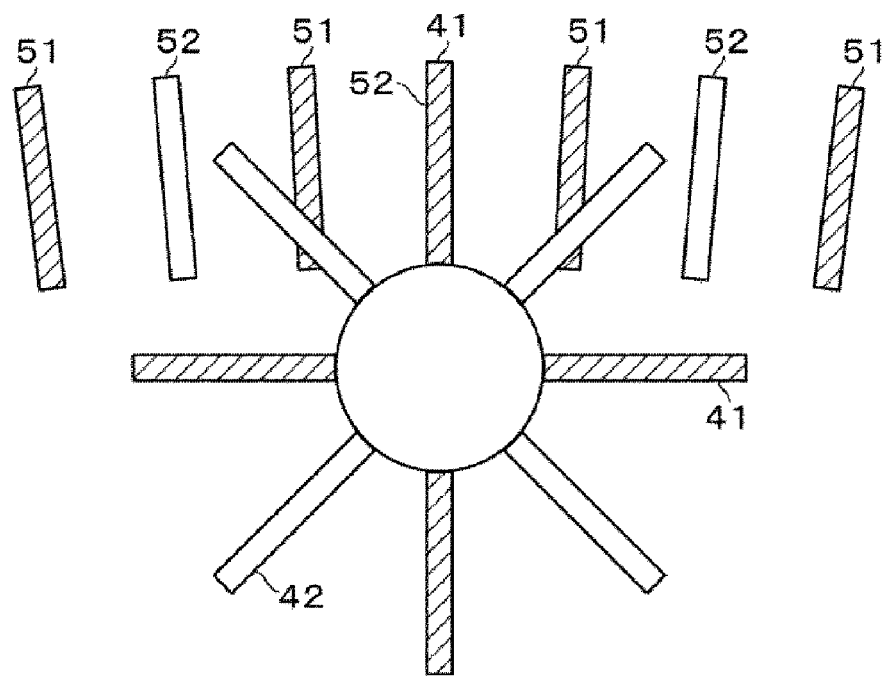
FIG. 4 is a plan view showing the driven gears and a portion of a driving gear.

The N-pole portions 51 and the S-pole portions 52, which are the respective magnetic pole portions of the driving gear 5, are arranged on the surface opposite the lower surfaces of the driven gears 4. In FIG. 4, the magnetic pole portions (the N-pole portions 41 and the S-pole portions 42) of one of the driven gears 4 are depicted in a corresponding relationship with the magnetic pole portions (the N-pole portions 51 and the S-pole portions 52) of the driving gear 5 disposed at the lower side of the respective driven gear 4. As described above, for example, the N-pole portions 51 and the S-pole portions 52 exposed on the surface of the annular driving gear 5 are formed in, for example, a strip shape so as to overlap with the shape of the N-pole portions 41 and the S-pole portions 42 formed on the lower surface of the driven gear 4 opposite the respective surface of the driving gear 5. FIG. 4 shows a state in which the N-pole portion 41 of the driven gear 4 and the S-pole portion 52 of the driving gear 5 overlap with each other. For example, in an actual example of the driving gear 5, the total number of N-pole portions 51 and S-pole portions 52 is about 300.

On the lower surface of the driving gear 5, there is provided a rotation-purpose rotating mechanism 53 formed of, for example, an annular direct drive motor (DD motor) for rotating the driving gear 5. By rotating the rotation-purpose rotating mechanism 53, the driving gear 5 is rotated about the center of the opening 50 as a rotation center. Therefore, the driving gear 5 and the rotary table 2 rotate about the same rotation axis. In this example, the rotary shaft 21 of the rotary table 2 is connected to the revolution-purpose rotating mechanism 22 provided in the opening 50 of the driving gear 5. However, the present disclosure is not limited to the above-described configuration as long as the rotary table 2 and the driving gear 5 are configured to rotate with their rotation centers aligned with each other.

Next, the revolution and rotation of the mounting stands 3 will be described. The driven gears 4 are stopped at the position determined by the overall action of an attraction force and a repulsion force acting between the respective magnetic pole portions (the N-pole portions 41 and the S-pole portions 42) of the driven gears 4 and the respective magnetic pole portions (the N-pole portions 51 and the S-pole portions 52) of the driving gear 5. Therefore, when the rotary table 2 and the driving gear 5 are rotated at the same number of rotations (rotation speed: rpm), the driven gears 4 are stopped relative to the driving gear 5. Thus, the driven gears 4, namely the mounting stands 3, are stopped without rotating about their own axes.

The mounting stands 3 are rotated about their own axes when a difference in the number of rotations is generated between the driving gear 5 and the rotary table 2, namely when a velocity difference is generated between the angular velocity of the driving gear 5 and the angular velocity (so-called revolution angular velocity) of the driven gears 4 caused by the rotation of the rotary table 2. When the angular velocity of the driving gear 5 is larger than the angular velocity of the driven gear 4 (when the velocity difference obtained by subtracting the angular velocity of the driven gear 4 from the angular velocity of the driving gear 5 is positive), the arrangement of the N-pole portions 51 and the S-pole portions 52 of the driving gear 5 moves from the left side to the right side in FIG. 4 under the arrangement of the N-pole portions 41 and the S-pole portions 42 of the driven gear 4 facing the driving gear 5. Therefore, the repulsion force and the attraction force from the driving gear 5 acting on the respective driven gear 4 transitions to the right side. Along with this, the arrangement of the N-pole portions 41 and the S-pole portions 42 of the respective driven gear 4 is also dragged to the right side. As a result, the driven gear 4 rotates clockwise.

When the angular velocity of the driving gear 5 is smaller than the angular velocity of the driven gear 4 (when the velocity difference obtained by subtracting the angular velocity of the driven gear 4 from the angular velocity of the driving gear 5 is negative), the arrangement of the N-pole portions 51 and the S-pole portions 52 of the driving gear 5 moves from the right side to the left side in FIG. 4 under the arrangement of the N-pole portions 41 and the S-pole portions 42 of the driven gear 4 facing the driving gear 5. Therefore, the repulsion force and the attraction force from the driving gear 5 acting on the driven gear 4 transitions to the left side. Along with this, the arrangement of the N-pole portions 41 and the S-pole portions 42 of the driven gear 4 is also dragged to the left side. As a result, the driven gear 4 rotates counterclockwise.

Figure 5:
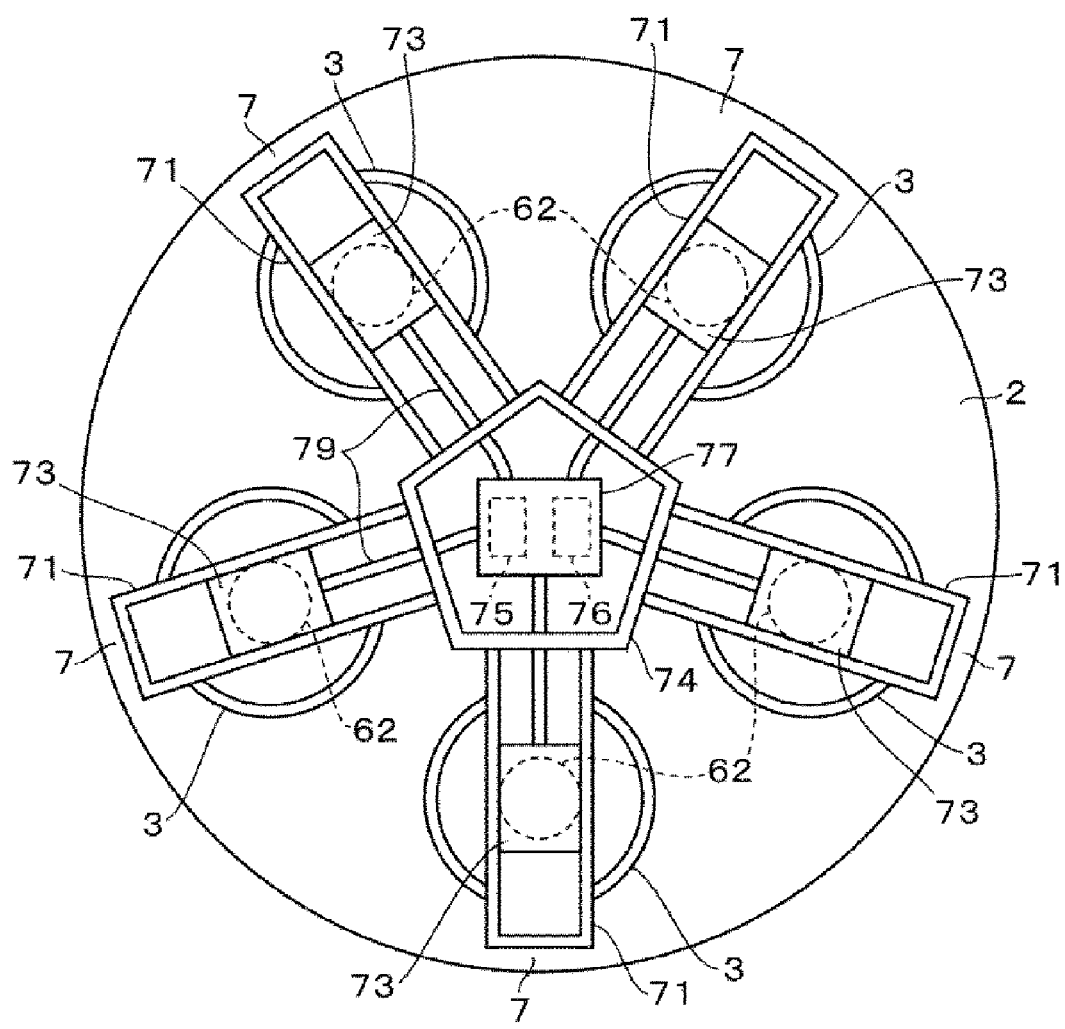
FIG. 5 is a plan view showing the rotary table provided with the rotation detection jig.
Figure 6:
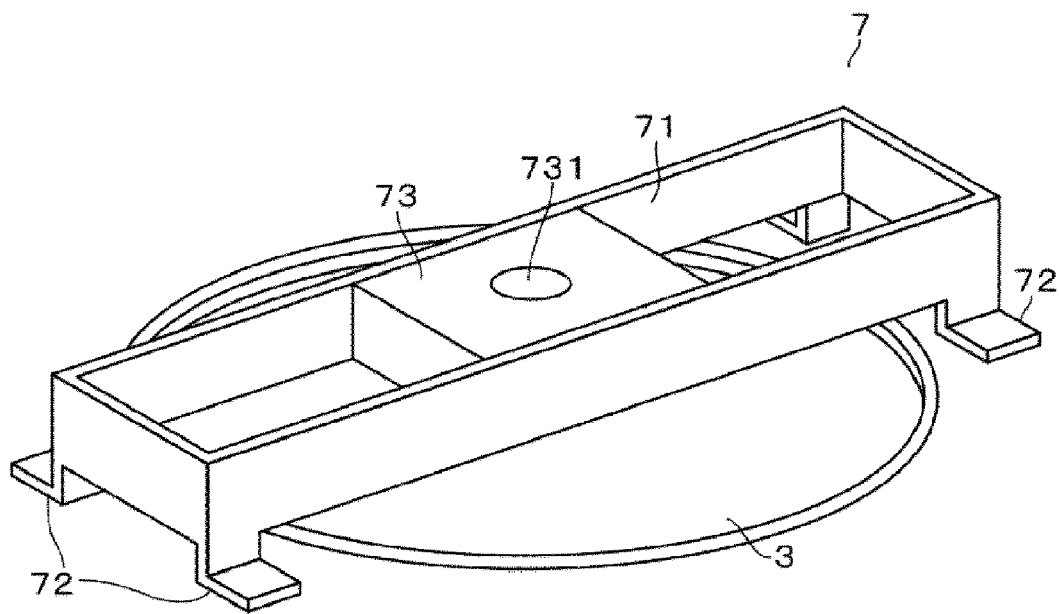
FIG. 6 is a perspective view showing a fixing member of the rotation detection jig.

Subsequently, the rotation detection jig for detecting the rotation amount of the mounting stand 3 will be described with reference to FIGS. 1, 5 and 6. A rotating element 61 is attached to each mounting stand 3 so as to rotate about the rotation shaft 32 of the mounting stand 3. As shown in FIG. 1, the rotating element 61 of this example is provided on one surface side of the mounting stand 3 so that the rotation center of the rotation shaft 32 and the rotation center of the rotating element 61 are aligned with each other.

For example, a plurality of hole portions for fixing the rotating element 61 is formed in the respective mounting stands 3. The rotating element 61 is attached to the hole portion by, for example, screws. The hole portion of the mounting stand 3 is formed at a position where the rotation center of the rotation shaft 32 of the mounting stand 3 and the rotation center of the rotating element 61 are aligned with each other. By attaching the rotating element 61 through the hole portion, the rotating element 61 is fixed in a state in which the center thereof is aligned with the rotation center of the rotation shaft 32 of the mounting stand 3.

On the other hand, an encoder main body 62 is disposed above the rotating element 61 in a non-contact manner with respect to the rotating element 61 in a state in which the encoder main body 62 is supported by a fixing member 7. The encoder main body 62 detects the rotation angle of the rotating element 61 and constitutes a rotary encoder 6 together with the rotating element 61.

The rotary encoder 6 in this example is configured to detect the rotation angle of the rotating element 61 by electromagnetic coupling. For example, the rotating element 61 includes a resonance coil. Further, the encoder main body 62 includes an excitation coil for exciting the resonance coil of the rotating element 61, and a detection coil electromagnetically coupled with the resonance coil inside the rotating element 61 and configured to detect a change in the angle of the rotating element 61 as a displacement of an electromagnetic coupling coefficient.

The fixing member 7 is used for fixing the encoder main body 62 to the rotary table 2. For example, as shown in FIGS. 1, 5 and 6, the fixing member 7 of this example is provided with a frame 71 having, for example, a rectangular planar shape. The frame 71 is fixed to the outer side of the mounting stand 3 in the rotary table 2 by leg portions 72 extending downward from the lower surfaces of four corner portions of the frame 71. A support portion 73 for supporting, for example, the upper portion of the encoder main body 62, is provided substantially at the center of the frame 71. In this way, the encoder main body 62 is fixed to the rotary table 2 by the fixing member 7 in a state in which it is supported by, for example, the support portion 73 at a position where the rotation angle of the rotating element 61 provided on the mounting stand 3 can be detected.

Figure 7:
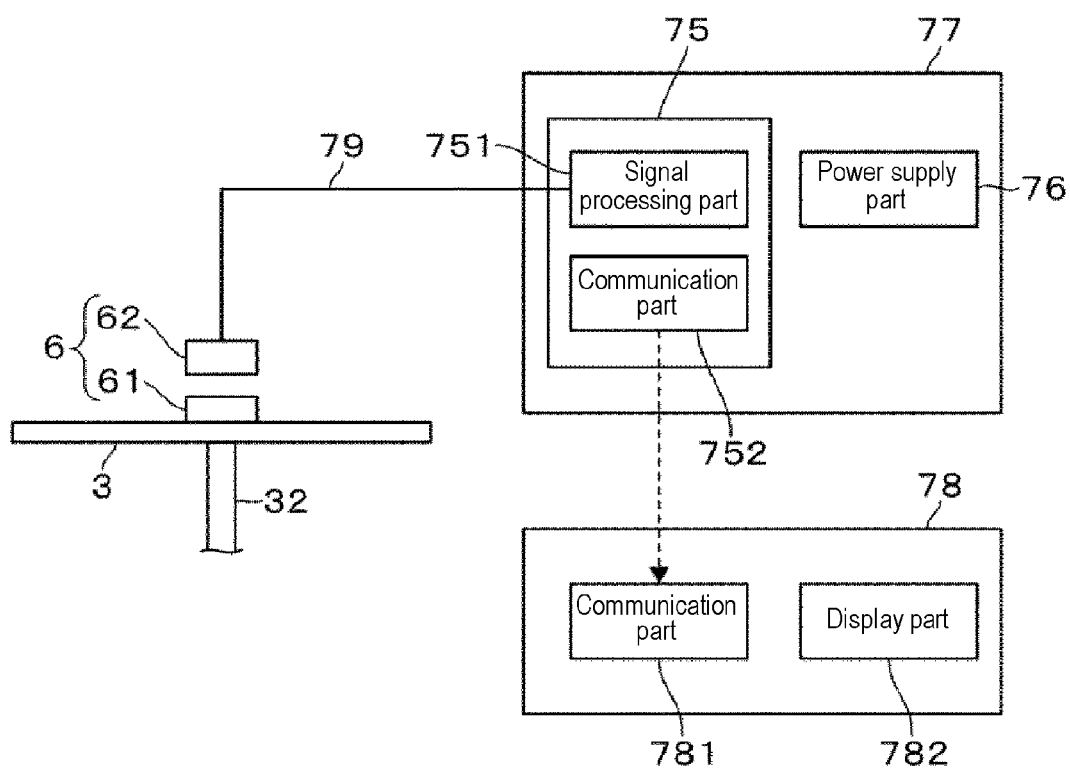
FIG. 7 is a configuration diagram of the rotation detection jig.

For example, a first controller 75 and a power supply part 76 for the first controller 75, which is formed of, for example, a battery, are attached to, for example, one surface side of the rotary table 2 in the vicinity of the rotation center via a holding member 74. In FIGS. 1 and 5, the first controller 75 and the power supply part 76 are depicted integrally as a controller unit 77. As shown in FIG. 7, the first controller 75 of this example includes a signal processing part 751 for processing a detection signal detected by the encoder main body 62, and a communication part 752. The first controller 75 has a function of obtaining, for example, a rotation angle per unit time, based on the detection signal provided from the encoder main unit 62, and transmitting the rotation angle thus obtained to an external second controller 78 via the communication part 752. The second controller 78 includes, for example, a communication part 781 and a display part 782. The second controller 78 is configured to display the rotation angle per unit time transmitted from the first controller 75 on the display part 782.

In this example, the rotary encoder 6 is attached to each mounting stand 3. For example, the first controller 75 and the power supply part 76 are provided commonly to five rotary encoders 6. The encoder main body 62 of each rotary encoder 6 and the first controller 75 are connected to each other by a cable 79. Reference numerals 731 and 741 in FIG. 1 denote openings for the cable 79 respectively formed in the support portion 73 of the encoder main body 62 and the holding member 74 of the controller unit 77.

Subsequently, a method of detecting the rotation amount of the mounting stand 3 will be described. For example, the detection of the rotation amount is performed at the time of manufacturing the rotary table 2, at the time of maintenance, or the like. First, on the one surface side of each mounting stand 3 of the rotary table 2, the rotating element 61 is screwed into to the hole portion (not shown) of the mounting stand 3, whereby the rotating element 61 is fixed to the mounting stand 3 with the rotation shaft 32 thereof aligned with the rotation center. Moreover, the encoder main body 62 is fixed to the rotary table 2 via the fixing member 7 so as to correspond to the rotating element 61 of each mounting stand 3. Further, the controller unit 77 is attached to one surface side of the rotary table 2 via the holding member 74. Then, by rotating the revolution-purpose rotating mechanism 22 and the rotation-purpose rotating mechanism 53 (the driving gear) as described above, the mounting stand 3 is revolved with the rotation of the rotary table 2 and is rotated about its own axis. Thus, in each mounting stand 3, the encoder main body 62 is revolved as the mounting stand 3 revolves. The rotating element 61 is rotated along with the rotation of the mounting stand 3. In addition, the controller unit 77 is also rotated as the rotary table 2 rotates.

When the rotating element 61 rotates, the rotation angle of the rotating element 61 is detected by the encoder main body 62 using the electromagnetic coupling. Based on this detection signal, the signal processing part 751 of the first controller 75 obtains, for example, a rotation angle per unit time as described above. The first controller 75 obtains respective rotation angles based on the detection values provided from the rotary encoders 6 of the five mounting stands 3 and transmits the data of the rotation angles to the second controller 78. The display part 782 of the second controller 78 displays, for example, the rotation angle per unit time for each mounting stand 3 thereon.

Although the rotating element 61 is directly attached to the mounting stand 3 in this example, the rotating element 61 may be attached to the wafer W and the rotation amount may be detected by mounting the wafer W on the mounting stand 3. In this case, the detection of the rotation amount is performed as described above by attaching the rotating element 61 to the wafer W so that the rotation center of the wafer W and the rotation center of the rotating element 61 are aligned with each other, and by mounting the wafer W on the mounting stand 3 so that the rotation shaft 32 of the mounting stand 3 and the rotation center of the rotating element 61 are aligned with each other.

According to the above-described embodiment, in order to detect the rotation amount of the mounting stand 3, the rotating element 61 is provided so as to rotate about the rotation shaft 32 of the mounting stand 3, and the encoder main body 62 that constitutes the rotary encoder 6 together with the rotating element 61 and detects the rotation angle of the rotating element 61 is fixed to the rotary table 2 (rotating part) by the fixing member 7. In addition, the first controller 75 including the signal processing part 751 for processing the detection signal detected by the encoder main body 62 is provided on the rotary table 2. Therefore, it is possible to accurately and easily detect the rotation amount of the mounting stand 3.

For example, when the rotation amount of the mounting stand 3 is obtained by imaging the mounting stand 3 with a video camera and analyzing the imaging result, the imaging needs to be performed in a state in which the rotation speed of the rotary table 2 is reduced, and the imaging result needs to be analyzed visually. Therefore, it takes a lot of time and effort. Moreover, since confirmation is performed visually, it is difficult to detect the rotation amount of the mounting stand 3 with high accuracy. On the other hand, according to the method of the present disclosure, the rotation amount can be grasped by the rotary encoder 6. Therefore, even if the rotation speed of the rotary table 2 is high, it is possible to accurately detect the rotation angle of the mounting stand 3 and to detect the rotation amount with high accuracy in a short period of time.

Further, since the signal processing part 751 is provided in the rotary table 2, the positional relationship between the encoder main body 62 and the signal processing part 751 is not changed with the rotation of the rotary table 2. Therefore, even if the encoder main body 62 and the signal processing part 751 are connected with each other by the cable 79, there is no possibility that the cable 79 is entangled by the rotation of the rotary table 2.

Furthermore, since the rotary encoder 6 is provided for each mounting stand 3, it is possible to simultaneously detect the rotation amounts of a plurality of mounting stands 3 and to reduce the total detection time. In addition, since the encoder main body 62 is arranged in a non-contact manner with respect to the rotating element 61, it is possible to detect the rotation angle without having to use sliding parts and to suppress dust generation. Moreover, since the rotating element 61 is provided on one surface side (upper surface side) of the mounting stand 3, it is easy to install the rotating element 61 and the encoder main body 62.

Furthermore, in this example, the rotation angle detected by the signal processing part 751 of the first controller 75 is transmitted to the second controller 78 and is displayed on the display part 782 of the second controller 78. Therefore, it is possible to grasp the rotation amount (rotation angle) of the mounting stand 3 in real time. In addition, since data is transmitted wirelessly, there is no fear of tangling of the cable or the like even when the mounting stand 3 revolves and rotates.

Further, the rotation detection jig may be attached to another rotary table 2. Therefore, by preparing the rotation detection jig, with respect to a plurality of rotary tables 2, it is possible to detect the rotation amounts of the mounting stands 3 provided in the rotary tables 2. Furthermore, the rotating element 61 and the encoder main body 62 of the rotary encoder 6 are not in contact with each other. Therefore, unlike an encoder in which a rotating element and an encoder main body are connected by a shaft, no additional torque is generated due to an axial deviation or the like. This makes it possible to detect the rotation amount with high accuracy.

Figure 8:
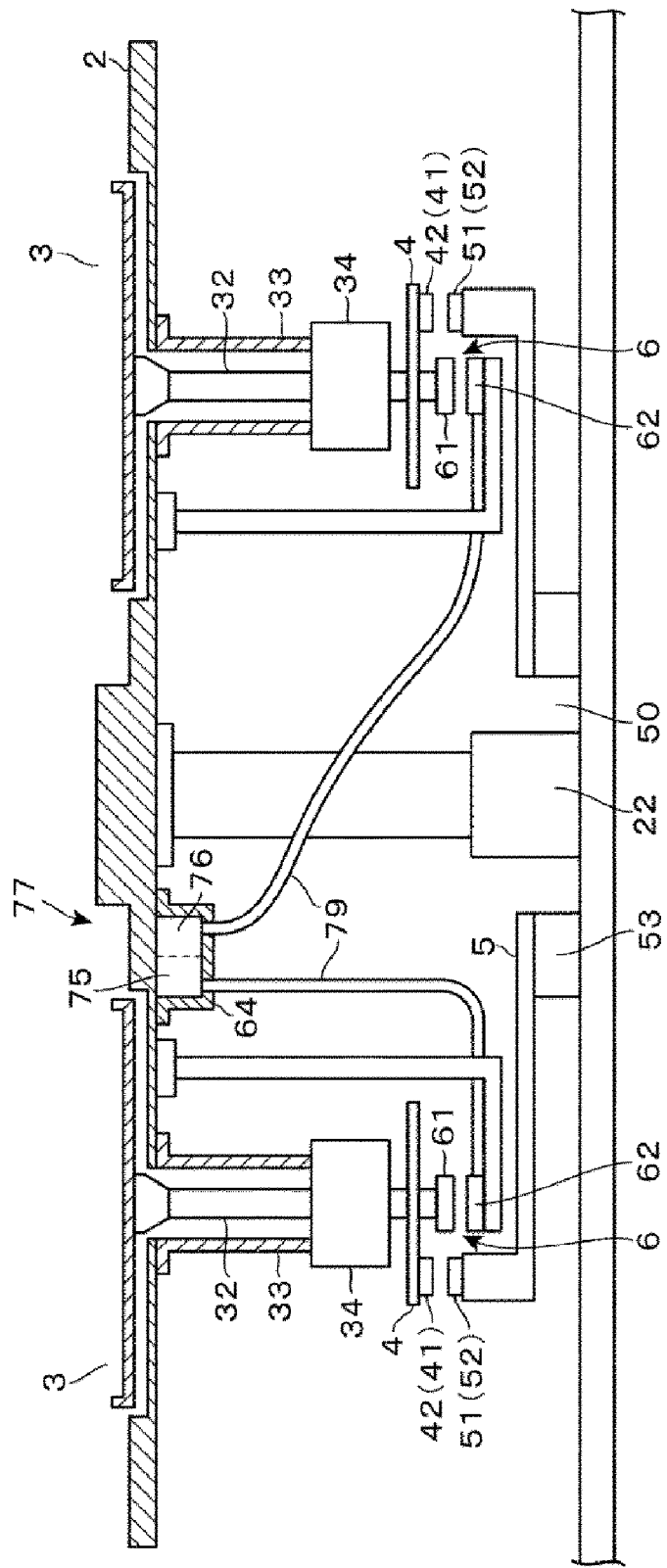
FIG. 8 is a vertical sectional side view showing another example of the rotary table provided with the rotation detection jig according to the present disclosure.

Subsequently, another example of the rotation detection jig will be described with reference to FIG. 8. In this example, the rotating element 61 is attached to the lower end of the rotation shaft 32 of the mounting stand 3, and the encoder main body 62 is provided below the rotating element 61. The rotation shaft 32 of the mounting stand 3 extends downward through, for example, the driven gear 4. The rotating element 61 is provided on the lower end side of the rotation shaft 32 in a state in which the rotation center of the rotating element 61 is aligned with the rotation shaft 32. Further, the encoder main body 62 is fixed to the lower portion of the rotary table 2 (rotating part) by the fixing member 63. In addition, the controller unit 77 including the first controller 75 and the power supply part 76 is attached to the lower side of the rotary table 2, for example, near the rotation center, by the holding member 64.

Although the magnetic pole portions (the N-pole portions 51 and the S-pole portions 52) of the driven gear 4 and the driving gear 5 are configured similarly to those of the above-described embodiment, the portion of the driving gear 5 for supporting the magnetic pole portions is configured to secure an installation region of the rotary encoder 6. Other configurations, such as the first controller 75 including the signal processing part 751 and the communication part 752, the external second controller 78 including the communication part 781 and the display part 782, and the like, are similar to those of the above-described embodiment. Similar components are denoted by same reference numerals, and the descriptions thereof are omitted.

Even in this example, when detecting the rotation amount of the mounting stand 3, the rotating element 61 is attached to the lower end of the rotation shaft 32 of each mounting stand 3, and the encoder main body 62 is fixed to the rotary table 2 via the fixing member 63. Further, the controller unit 77 is fixed to the lower surface of the rotary table 2 via the holding member 64. The rotary encoder 6 of each mounting stand 3 and the controller unit 77 are connected to each other by the cable 79. Then, the mounting stand 3 is revolved and rotated about its own axis by the above-described method. The rotation angle of the rotating element 61 is detected by the encoder main body 62. Based on this detection signal, the signal processing part 751 of the first controller 75 obtains, for example, a rotation angle per unit time. Then, the display part 782 of the second controller 78 displays, for example, the rotation angle per unit time for each mounting stand 3.

Even in this example, similar to the above-described embodiment, it is possible to accurately and easily detect the rotation amount of the mounting stand 3 revolved by the rotation of the rotary table 2 and rotated on its own axis. It is also possible to achieve the same effects as those of the above-described embodiment, such as an effect of simultaneously detecting the rotation amounts of a plurality of mounting stands 3, an effect of grasping the rotation amounts (rotation angles) of the mounting stands 3 in real time while suppressing dust generation, and the like. Furthermore, since the rotary encoder 6 and the controller unit 77 are provided on the lower surface side of the rotary table 2, it is possible to grasp the rotation amounts of the mounting stands 3, for example, in a state in which the wafers W are mounted on the mounting stands 3.

In this example, the rotating element 61 and the encoder main body 62 may be connected to each other and integrally provided to constitute the rotary encoder 6, and the rotary encoder 6 may be attached to the rotary table 2 by the fixing member 63.

In the rotation detection jig of the present disclosure described above, it is not necessarily required to mount the rotary encoders 6 on all the mounting stands 3. For example, the rotary encoder 6 may be attached to a single mounting stand 3 to detect the rotation amount of the respective mounting stand 3. Then, the rotary encoder 6 may be removed and attached to another mounting stand 3 to detect the rotation amount of the respective mounting stand 3.

Figure 9:
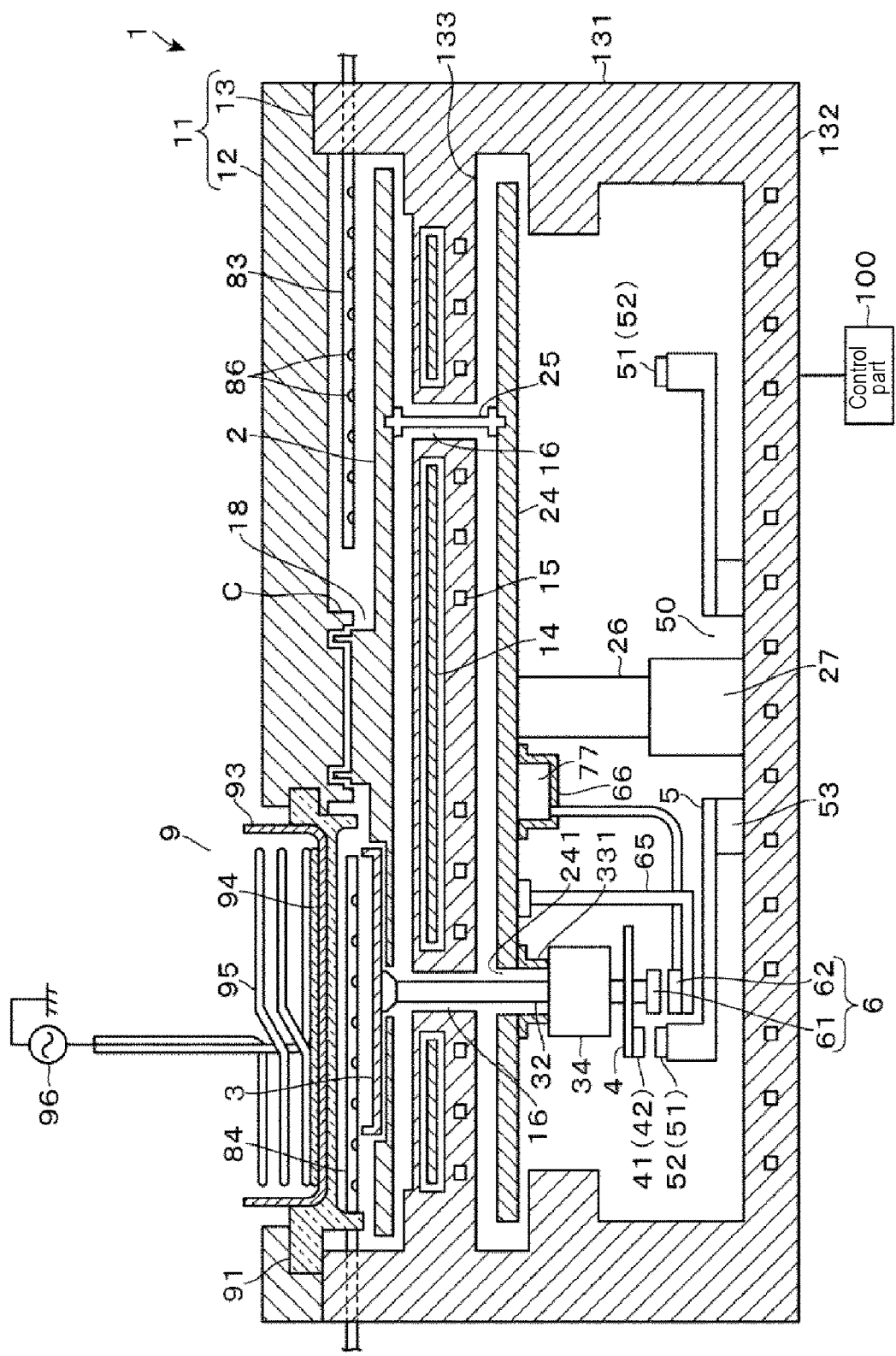
FIG. 9 is a vertical sectional side view showing an embodiment of a film forming apparatus to which the substrate processing apparatus of the present disclosure is applied.

Subsequently, as one embodiment of the substrate processing apparatus of the present disclosure, a configuration in which the mechanism for detecting the rotation amount of the mounting stand 3 is provided in the film forming apparatus 1 for subjecting a wafer W to ALD as a film forming process will be described with reference to FIGS. 9 to 11. As shown in FIG. 9, the film forming apparatus 1 includes a vacuum container 11 that constitutes a processing container in which a film forming process is performed. The vacuum container 11 includes a container body 13 that defines a side wall 131 and a bottom portion 132 of the vacuum container 11, and a top plate 12 that airtightly closes an upper surface side opening of the container body 13. A rotary table 2 formed in a disk shape is provided inside the vacuum container 11. The rotary table 2 in this example is supported from below by a disk-shaped support plate 24. The support plate 24 is configured to support mounting stands 3 independently of the rotary table 2.

In the vacuum container 11, a partition wall portion 133 is formed so as to face the bottom portion 132. The rotary table 2 is provided above the partition wall portion 133, and the support plate 24 is provided below the partition wall portion 133. A heater 14 and a coolant flow path 15 are provided in the partition wall portion 133, and an annular slit 16 is formed in the partition wall portion 133. On the lower surface of the rotary table 2, a plurality of support pillars 25 is provided in the circumferential direction so as to extend vertically downward from a position corresponding to the slit 16. Each support pillar 25 passes through the slit 16 and is connected to the support plate 24. The lower surface side central portion of the support plate 24 is connected to a revolution-purpose rotating mechanism 27 via a rotary shaft 26. Accordingly, when the rotary shaft 26 is rotated, the rotary table 2 rotates about a vertical axis via the support plate 24 and the support pillars 25. In this way, the support plate 24 corresponds to a rotating part including the rotary table 2.

The rotation shaft 32 of the mounting stand 3 penetrates through the slit 16 of the partition wall portion 133 and the opening portion 241 of the support plate 24 and extends downward. The rotation shaft 32 is connected to a bearing unit 34 fixed to the lower side of the support plate 24 via a cylindrical body 331. The mounting stand 3, the configuration of the magnetic pole portions of the driven gears 4 and the driving gear 5, the provision of the revolution-purpose rotating mechanism 27 inside the opening portion 50 of the driving gear 5, and the like, are configured similarly to those of the rotation detection jig shown in FIG. 1. However, the portion of the driving gear 5 for supporting the magnetic pole portions is configured to secure an installation region of a rotary encoder 6 to be described later.

In the central portion of the lower surface of the top plate 12, there are formed a central region forming portion C having a circular planar shape, and protrusion portions 17 and 17 having a fan-like planar shape, which are formed so as to extend from the central region forming portion C toward the outside of the rotary table 2. In the internal space of the vacuum container 11, the central region forming portion C and the protrusion portions 17 and 17 form a ceiling surface lower than the outer region thereof. The gap between the central region forming portion C and the central portion of the rotary table 2 constitutes a flow path 18 for an $N_2$ gas.

Figure 10:
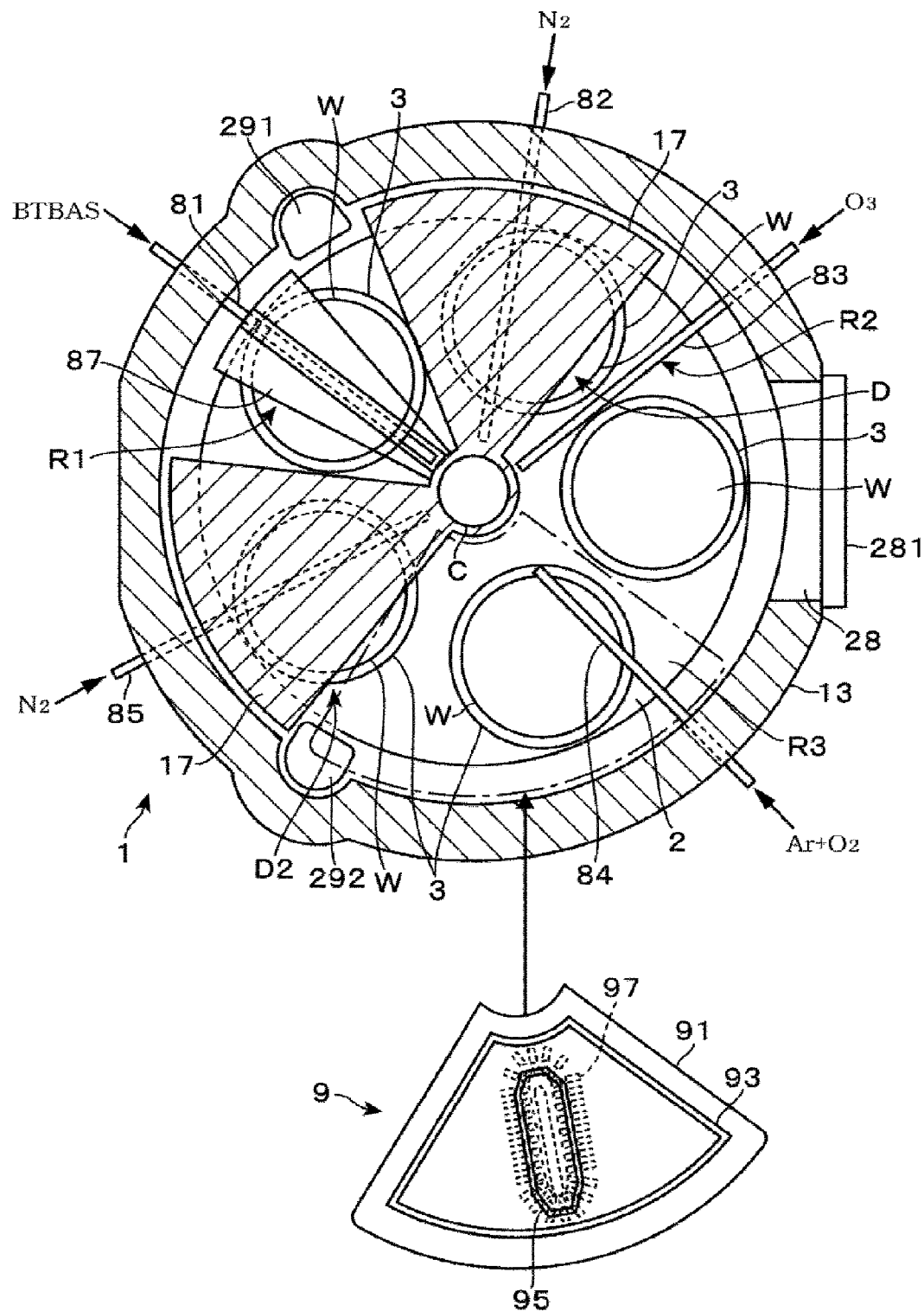
FIG. 10 is a transverse plan view showing the film forming apparatus.

As shown in FIG. 10, on the side wall surface of the vacuum container 11 (the container body 13), there is provided a loading/unloading port 28 configured to be opened and closed by a gate valve 281. The wafer W held by an external transfer mechanism (not shown) is loaded into the vacuum container 11 via the loading/unloading port 28 and is delivered to the mounting stand 3. The delivery of the wafer W between the mounting stand 3 and the transfer mechanism is performed by using lift pins configured to be able to move up and down through through-holes (not shown) provided in each mounting stand 3. Descriptions of the lift pins are omitted.

As shown in FIGS. 9 and 10, in the film forming apparatus 1, a raw material gas nozzle 81, a separation gas nozzle 82, an oxidizing gas nozzle 83, a modifying gas nozzle 84 and a separation gas nozzle 85 are arranged above the rotary table 2 in the named order at intervals in the rotational direction of the rotary table 2. Each of the gas nozzles 81 to 85 is formed in a rod shape extending horizontally along the radial direction of the rotary table 2 from the side wall of the vacuum container 11 toward the central portion. Various gases are discharged downward from a large number of discharge holes 86 formed at intervals along the length direction of each of the gas nozzles 81 to 85.

The raw material gas nozzle 81 discharges, for example, a BTBAS gas. Reference numeral 87 in FIG. 10 denotes a nozzle cover that covers the raw material gas nozzle 81. The nozzle cover 87 serves to increase the concentration of the BTBAS gas below the nozzle cover 87. The oxidizing gas nozzle 83 discharges, for example, an $O_3$ gas. The separation gas nozzles 82 and 85 are configured to discharge, for example, an $N_2$ gas and are disposed at such positions as to divide the respective protrusion portions 17 and 17 of the top plate 12 in the circumferential direction when viewed from the top. The modifying gas nozzle 84 discharges a modifying gas composed of, for example, a mixed gas of an argon (Ar) gas and an oxygen ($O_2$) gas. In this example, each of the raw material gas, the oxidizing gas and the modifying gas corresponds to a processing gas.

In the top plate 12, a plasma forming part 9 is provided above the modifying gas nozzle 84. In FIG. 10, the position where the plasma forming part 9 is provided is indicated by a one-dot chain line. An antenna 95 formed by winding a metal wire in a coil shape is provided on the upper surface side of the main body portion 91 made of a dielectric material such as quartz or the like via a Faraday shield 93 and an insulating member 94. A high frequency power source 96 is connected to the antenna 95. Reference numeral 97 in FIG. 10 denotes slits for directing a magnetic field component of an electromagnetic field downward.

On the rotary table 2, the lower region of the raw material gas nozzle 81 corresponds to an adsorption region R1 where the BTBAS gas is adsorbed, and the lower region of the oxidizing gas nozzle 83 corresponds to an oxidizing region R2 where the BTBAS gas is oxidized. Furthermore, the lower region of the plasma forming part 9 constitutes a modifying region R3 in which a $SiO_2$ film is modified by plasma. The lower regions of the protrusion portions 17 and 17 constitute separation regions D1 and D2 for separating the adsorption region R1 and the oxidizing region R2 from each other using the $N_2$ gas discharged from the separation gas nozzles 82 and 85. Reference numerals 291 and 292 in FIG. 10 denote exhaust ports.

Subsequently, a mechanism for detecting the rotation amount of the mounting stand 3 will be described. In this example, a rotating element 61 is provided at the lower end of the rotation shaft 32 of the mounting stand 3, and an encoder main body 62 is provided below the rotating element 61. The rotation shaft 32 of the mounting stand 3 extends downward through, for example, a driven gear 4. For example, on the lower end side of the rotation shaft 32, the rotating element 61 is provided in a state in which the rotation center thereof is aligned with the rotation shaft 32. In addition, the encoder main body 62 is attached to the lower portion of the support plate 24, which is a rotating part, by a fixing member 65. Further, a controller unit 77 including a first controller 75 and a power supply part 76 is provided via a holding member 66, for example, near the rotation center on the lower side of the support plate 24. The first controller 75 includes a signal processing part 751 and a communication part 752 as in the above-described embodiment. The first controller 75 is configured to transmit rotation angle data to, for example, a control part 100 to be described later. Other configurations are similar to those of the embodiment shown in FIG. 1. Similar constituent parts are denoted by the same reference numerals, and the descriptions thereof are omitted.

Figure 11:
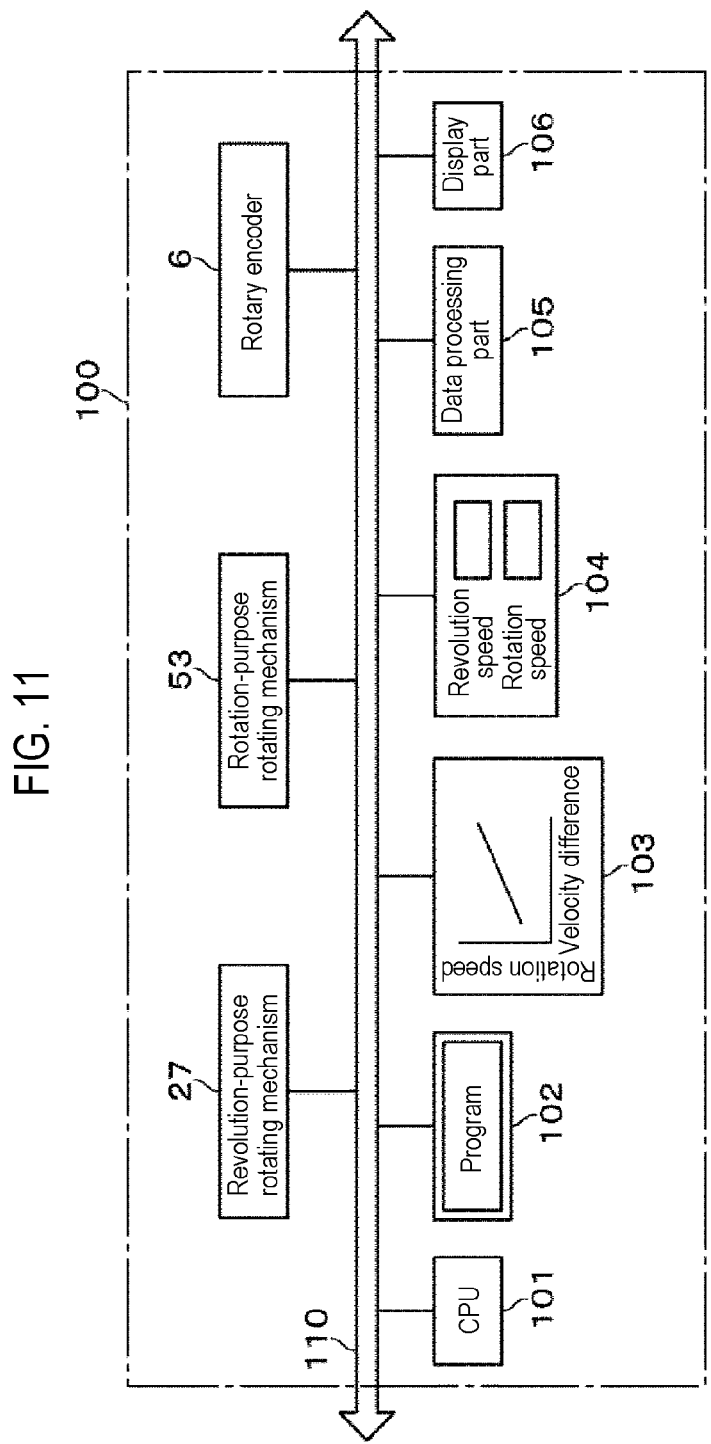
FIG. 11 is a configuration diagram showing an example of a control part provided in the film forming apparatus.

As shown in FIG. 11, the film forming apparatus 1 is provided with a control part 100 formed of a computer for controlling the overall operation of the apparatus. The control part 100 includes a CPU 101, a program storage part 102 that stores a program for executing an operation of the film forming apparatus 1 relating to a film forming process and a rotation amount detection process (to be described later), a memory part 103, an input part 104, a data processing part 105, and a display part 106. Reference numeral 110 in FIG. 11 denotes a bus for connection to a revolution-purpose rotating mechanism 27 for the rotary table 2, a rotation-purpose rotating mechanism 53 for the mounting stand 3 and a rotary encoder 6.

The memory part 103 stores, for example, the relationship between the rotation speed of the driven gear 4 and the velocity difference (Va−Vb) between the angular velocity of the driven gear 4 due to revolution and the angular velocity of the driving gear 5. The present inventors have found that the velocity difference between the angular velocity of the driven gear 4 due to revolution and the angular velocity of the driving gear 5 maintain a substantially proportional relationship with the rotation speed of the driven gear 4 in a certain range of the speed difference. For example, when the velocity difference (Va−Vb) between the angular velocity Va of the driving gear 5 and the angular velocity Vb of the driven gear 4 due to revolution is positive ((Va−Vb)>0), the clockwise rotation speed becomes higher as the velocity difference grows larger. When the velocity difference is negative ((Va−Vb)<0), the counterclockwise rotation speed becomes higher as the velocity difference grows larger.

The input part 104 is formed of, for example, an operation screen, and is used for inputting the rotation speed of the driven gear 4 and the angular velocity of the driven gear 4 due to revolution (the number of rotations of the rotary table 2). The data processing part 105 is configured to set the number of rotations of the driving gear 5 based on the input rotation speed of the driven gear 4, the number of rotations of the rotary table 2 and the relationship stored in the memory part 103. The rotation speed of the driven gear 4 and the angular velocity of the driven gears 4 due to the revolution may be inputted during maintenance, for example. If the rotation speed and the angular velocity of the driven gear 4 are inputted, the velocity difference between the angular velocity of the driven gear 4 due to the revolution and the angular velocity of the driving gear 5 is grasped from the aforementioned relationship on the basis of the inputted rotation speed. Then, the number of rotations of the driving gear 5 is set. The display part 106 displays, for example, the detected values of the rotation amount (rotation angle) of the mounting stand 3, which is transmitted from the communication part 752 of the first controller 75.

Hereinafter, an operation method of the film forming apparatus 1 configured as above will be described. First, at the time of performing a film forming process, while intermittently rotating the rotary table 2, each mounting stand 3 is moved to a position facing the loading/unloading port 28. A wafer W is loaded from the outside into the vacuum container 11 by using a transfer mechanism (not shown) and is delivered to the mounting stand 3. Thereafter, the interior of the vacuum container 11 is evacuated to have a predetermined pressure via the exhaust ports 291 and 292. An $N_2$ gas is supplied to the rotary table 2 from the separation gas nozzles 82 and 85 and the central region forming portion C. The heating of the wafer W by the heater 14 is started to heat the wafer W to a temperature of, for example, 400 degrees C.

Then, the rotary table 2 is rotated by the revolution-purpose rotating mechanism 27 at a rotation speed of 80 rpm or more, for example, 120 rpm. The driving gear 5 is rotated by the rotation-purpose rotating mechanism 53. As a result, the mounting stand 3 revolves and rotates on its own axis. Meanwhile, inside the vacuum container 11, the supply of the respective processing gases from the raw material gas nozzle 81, the oxidizing gas nozzle 83 and the modifying gas nozzle 84 and the formation of plasma by the application of a high frequency to the antenna 95 from the high frequency power source 96 are started.

Each wafer W sequentially passes through the adsorption region R1, the oxidizing region R2 and the modifying region R3. In the adsorption region R1, the BTBAS gas is adsorbed onto the wafer W. In the oxidizing region R2, the adsorbed BTBAS gas is oxidized by the $O_3$ gas, whereby one or more molecular layers of $SiO_2$ are formed. In the modifying region R3, the molecular layers of $SiO_2$ are modified by being exposed to the plasma of the modifying gas. With the rotation of the rotary table 2, the above-described cycles are repeatedly executed a plurality of times, whereby the molecular layers of $SiO_2$ are stacked one above another so that an $SiO_2$ film is formed on the surface of the wafer W.

In the film forming apparatus 1, the number of rotations of the rotary table 2 and the rotation speed of the mounting stand 3 are set so as not to synchronize the rotation of the rotary table 2 with the rotation of the mounting stand 3. That is to say, the number of rotations of the rotary table 2 and the rotation speed of the mounting stand 3 are set so that the wafer W is rotated on its own axis at such a rotation speed that the rotary table 2 makes one revolution from a start point in a state in which the wafer W is oriented in a first direction and, when the rotary table 2 is positioned at the start point again, the wafer W is oriented in a second direction different from the first direction. As described above, the mounting stand 3 rotates on its own axis without synchronizing with the rotation of the rotary table 2. Therefore, the wafer W mounted on each mounting stand 3 can pass through the adsorption region R1 of the raw material gas in various orientations due to rotation and revolution. Thus, when viewed in the circumferential direction of the wafer W, the bias of the film thickness of the $SiO_2$ film formed on the wafer W is suppressed.

By the above-described operation, the molecular layers of $SiO_2$ are sequentially stacked one above another. After a preset number of cycles is executed, the rotation of the rotary table 2, the supply of various gases, the formation of plasma, and the operation of the revolution-purpose rotating mechanism 27 and the rotation-purpose rotating mechanism 53 are stopped to terminate the film forming process. Thereafter, the internal pressure of the vacuum container 11 is adjusted. The gate valve 281 is opened to allow the external transfer mechanism to enter the vacuum container 11. The wafer W is unloaded in the procedure opposite to the loading procedure.

In addition, in the film forming apparatus 1, the rotation amount of the mounting stand 3 is detected, for example, during maintenance or when optimizing processing conditions. In this case, a step of revolving the mounting stand 3 by the above-described method and rotating the mounting stand on its own axis, and a step of detecting the rotation angle of the mounting stand 3 (driven gear 4) are carried out. In the step of detecting the rotation angle, as in the above-described embodiment, the rotation angle of the rotating element 61 that rotates about the rotation shaft 32 of the mounting stand 3 is detected by the encoder main body 62, and the signal processing part 751 of the first controller 75 obtains, for example, a rotation angle per unit time for each mounting stand 3 based on this detection signal. Then, a step of transmitting the data of the rotation angle to the control part 100 via the communication part 752 and displaying, for example, the rotation angle per unit time for each mounting stand 3 on the display part 106 is carried out.

According to this embodiment, similar to the above-described embodiment, it is possible to accurately and easily detect the rotation amount of the mounting stand 3 which is revolved by the rotation of the rotary table 2 and rotated on its own axis. It is also possible to obtain the same effects as those of the above-described embodiment, such as the simultaneous detection of the rotation amounts of a plurality of mounting stands 3, the grasping of the rotation amounts (rotation angles) of the mounting stands 3 in real time while suppressing dust generation, and the like. Furthermore, since the mechanism for detecting the rotation amount of the mounting stand 3 is provided in the film forming apparatus 1, it is possible to grasp the relationship between the state of substrate processing and the rotation amount of the mounting stand 3. This enables a user of the apparatus to optimize the rotation amount according to the type of substrate processing.

Even in this example, the rotating element 61 and the encoder main body 62 may be connected to each other and integrally provided to constitute the rotary encoder 6, and the rotary encoder 6 may be fixed to the rotary table 2 by a fixing member 65.

In the present disclosure, a driven gear provided in a rotation shaft of a mounting stand and a driving gear provided so as to face a revolution trajectory of the driven gear and configured to constitute a magnetic gear mechanism together with the driven gear may be used so that the driven gear can be rotated by operating the driving gear.

For example, in the driving gear, a plurality of electromagnets may be arranged in the circumferential direction of the rotary table. For example, three electromagnets continuously arranged side by side may be provided as one set, and a three-phase alternating current signal may be supplied to each set of electromagnets so that magnetic poles can move in the circumferential direction of the rotary table (so that the arrangement of magnetic poles varies with time). That is to say, the driving gear may be configured to rotate a so-called sun gear in which permanent magnets are annularly arranged as in the above-described embodiment. Alternatively, by controlling an electric current supplied to stationary electromagnets so that the arrangement of magnetic poles along a revolution trajectory varies with time, the magnetic force acting between the driving gear and the driven gear may be changed to rotate the driven gear on its own axis. That is to say, the driving gear may have a configuration in which the arrangement of magnetic poles along the revolution trajectory varies with time as viewed from a stationary position on the revolution trajectory.

As described above, according to the present disclosure, when viewed from the stationary position on the revolution trajectory, the arrangement of magnetic poles along the revolution trajectory of the driving gear may be changed with time to thereby rotate the driven gear on its own axis, and the rotation angle of the driven gear (mounting stand) may be detected using the rotary encoder. The rotation angle of the mounting stand may be the rotation angle of the mounting stand per unit time as described above or may be the rotation angle of the mounting stand per one rotation of the rotary table.

In the case where the driving gear is annularly arranged, only one of the driven gears and the driving gear may be a magnetic body. Furthermore, in the case where the driven gears include one of the N-pole portions and the S-pole portions, or the N-pole portions and the S-pole portions alternately arranged, the driving gear may be made of a magnetic material. In addition, in the case where the driving gear includes one of the N-pole portions and the S-pole portions, or the N-pole portions and the S-pole portions alternately arranged, the driven gears may be made of a magnetic material.

Furthermore, at least one of a plurality of driven gears may be rotated on its own axis by operating the driving gear. For example, the driving gear may be provided so as to face a portion of the revolution trajectory of the driven gears. For example, when the driven gears come close to the driving gear by the rotation of the rotary table, the driven gears may be rotated on their own axis by the driving gear using the repulsive force between the magnetic gears.

In addition, the signal processing part provided in the first controller is not limited to obtaining the rotation angle per unit time based on the detection signal, but may be configured to convert the detection signal into a signal for communication. In this case, for example, the rotation angle per unit time is obtained by the second external controller which has received the signal. Furthermore, the first controller may store, for example, the rotation angle per unit time or the time-series data of the rotation angle obtained by the signal processing part in an external memory detachably attached to the first controller. After the rotary table is stopped, the memory may be removed and the data in the memory may be analyzed by an operator.

Furthermore, the power supply part does not necessarily have to be provided in the rotating portion including the rotary table. Electric power may be transmitted to the first controller using, for example, a slip ring.

Example

Next, evaluation tests will be described.
(Evaluation Test 1)
An evaluation test was conducted using a configuration in which, in the rotary table 2 shown in FIG. 1, the driving gear 5 is formed of 300 magnetic pole portions (N-pole portions 51 and S-pole portions 52), the driven gear 4 is formed of 18 magnetic pole portions (N-pole portions 41 and S-pole portions 42), and the distance between the driving gear 5 and the driven gear 4 is set to 5 mm. The rotation detection jig (the rotary encoder 6 and controller unit 77) shown in FIG. 1 was attached to the rotary table 2. The rotary table 2 was rotated clockwise at 30 rpm. As for a case where the number of rotations of the driving gear 5 is advanced by 0.1 degree/second (6 degrees/minute) and a case where the number of rotations of the driving gear 5 is delayed by 0.1 degree/second (6 degrees/minute), the rotation angle of each mounting stand 3 was measured.

In order to measure the rotation angles of five mounting stands 3 at the same time, the rotation start angles of the respective mounting stands 3 were set at different values. Thus, the rotation angles of the five mounting stands 3 were detected by the respective encoder main bodies 62. The rotation angle per unit time was obtained by the signal processing part 751 of the first controller 75 and was displayed on the display part 782 of the second controller 78. A time-dependent change of each rotation angle was obtained.

Figure 12:
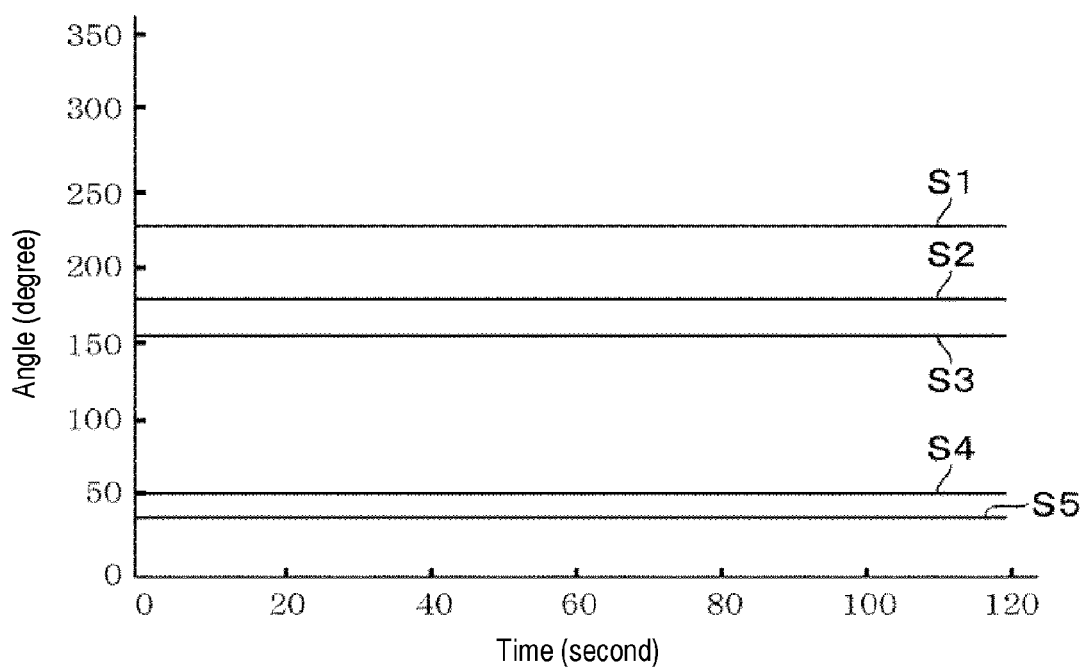
FIG. 12 is a characteristic graph showing the results of an evaluation test according to the present disclosure.
Figure 13:
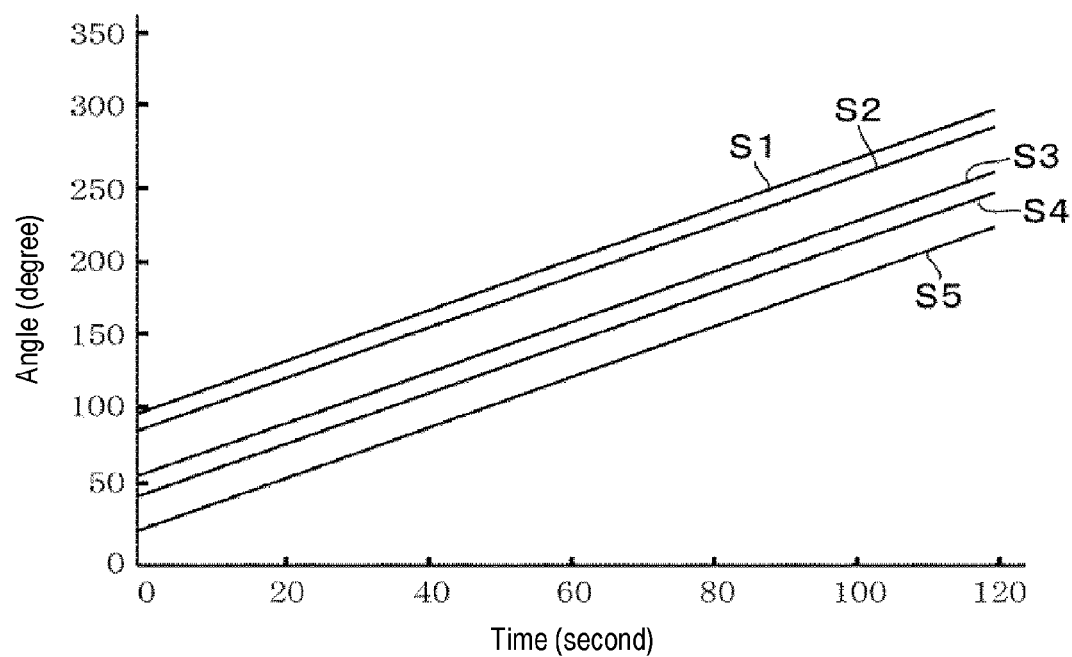
FIG. 13 is a characteristic graph showing the results of an evaluation test according to the present disclosure.
Figure 14:
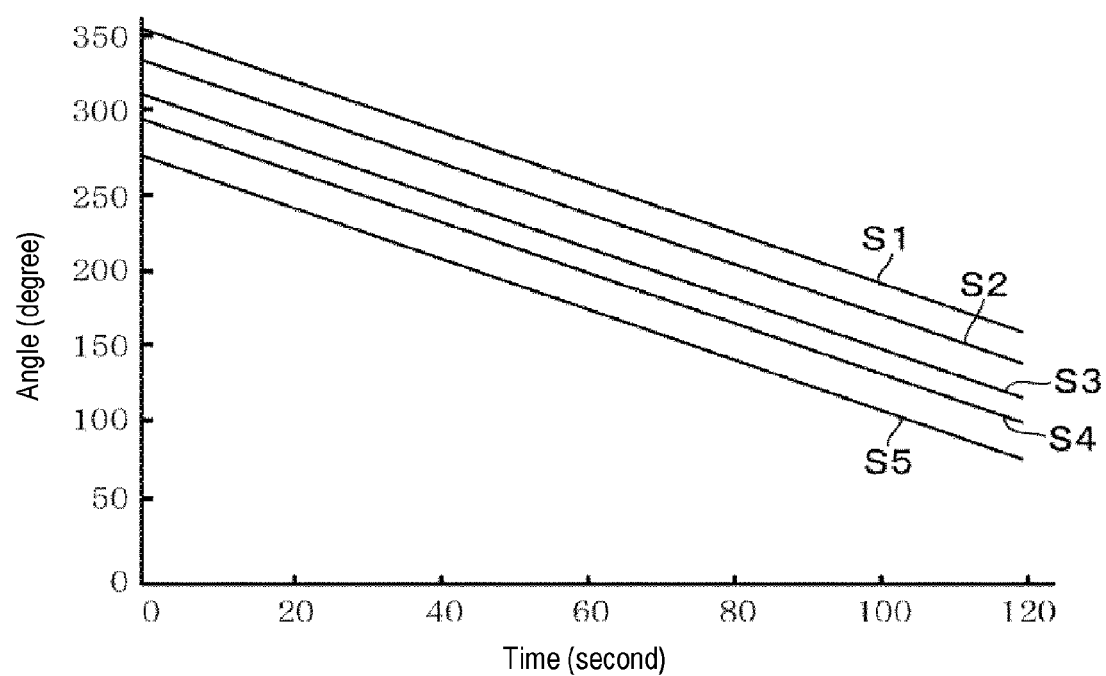
FIG. 14 is a characteristic graph showing the results of an evaluation test according to the present disclosure.

As for the measurement results, FIG. 12 shows the measurement result in the case where the number of rotations of the driving gear 5 is the same as the number of rotations of the rotary table 2, FIG. 13 shows the measurement result in the case where the number of rotations is advanced, and FIG. 14 shows the measurement result in the case where the number of rotations is delayed. In FIGS. 12 to 14, the horizontal axis represents the time (second) and the vertical axis represents the rotation angle (degree). Data of the five mounting stands 3 are indicated by S1 to S5, respectively. According to FIG. 12, it was recognized that when the number of rotations of the driving gear 5 and the number of rotations of the rotary table 2 are the same, each mounting stand 3 stops rotation on its own axis. Further, it was recognized that when the number of rotations of the driving gear 5 is advanced, the five mounting stands 3 are simultaneously rotated clockwise and that when the number of rotations of the driving gear 5 is delayed, the five mounting stands 3 are simultaneously rotated counterclockwise.

In FIGS. 13 and 14, the inclinations of the data S1 to S5 of the five mounting stands 3 are uniform. It was recognized that by using the rotation detection jig of the present disclosure, it is possible to accurately and easily detect the rotation amounts (rotation angles) of the five mounting stands 3 in a short period of time. When the number of rotations is advanced, it was recognized that while the rotary table 2 makes one rotation, the respective mounting stands 3 are rotated by 3.35 degrees, 3.34 degrees, 3.34 degrees, 3.34 degrees and 3.34 degrees and the five mounting stands 3 are rotated clockwise on their own axis at 0.28 rpm almost in the same way. On the other hand, when the number of rotations is delayed, it was recognized that while the rotary table 2 makes one rotation, the respective mounting stands 3 are rotated by 3.32 degrees, 3.31 degrees, 3.32 degrees, 3.32 degrees and 3.31 degrees and the five mounting stands 3 are rotated counterclockwise on their own axis at 0.28 rpm almost in the same way.

(Evaluation Test 2)

The rotation detection jig was attached to the same rotary table 2 as used in evaluation test 1. The rotary table 2 was rotated clockwise at 30 rpm, 60 rpm and 120 rpm. The rotation velocity difference between the driving gear 5 and the rotary table 2 was changed between −0.8 degrees/sec to 0.8 degrees/sec. The rotation amount of each mounting stand 3 was evaluated. As described above, the rotation velocity difference refers to the velocity difference between the angular velocity of the driving gear 5 and the angular velocity (revolution angular velocity) of the driven gear 4 due to the rotation of the rotary table 2.

Figure 15:
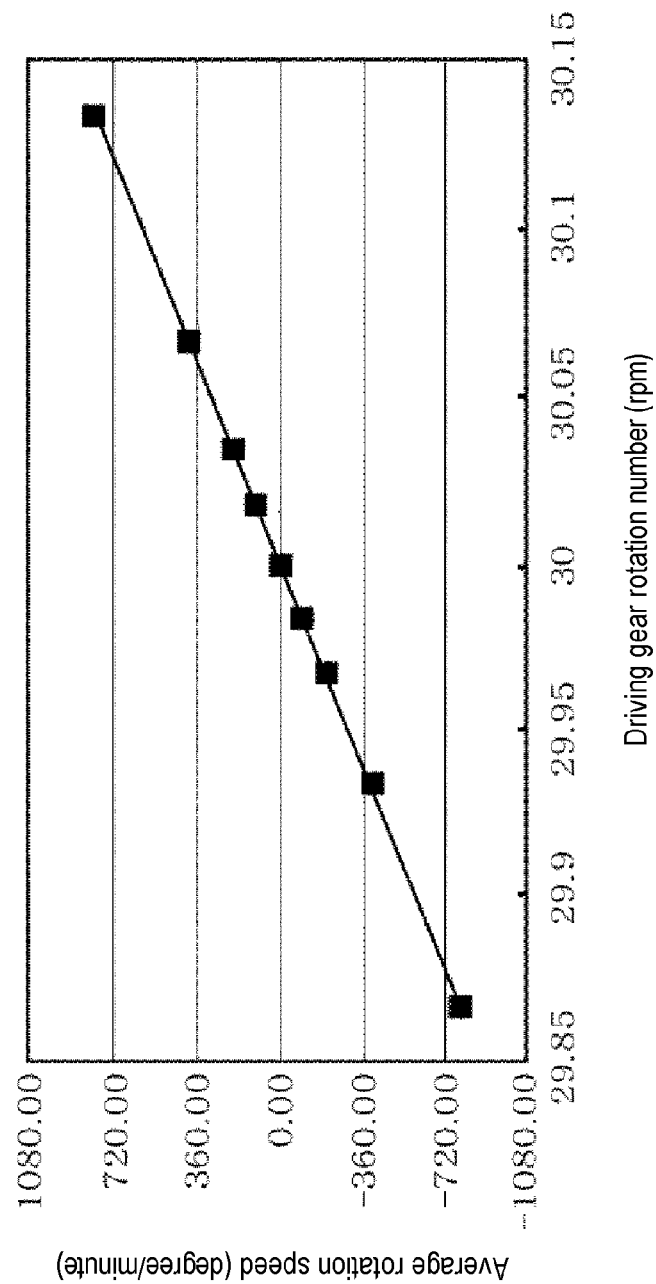
FIG. 15 is a characteristic graph showing the results of an evaluation test according to the present disclosure.
Figure 16:
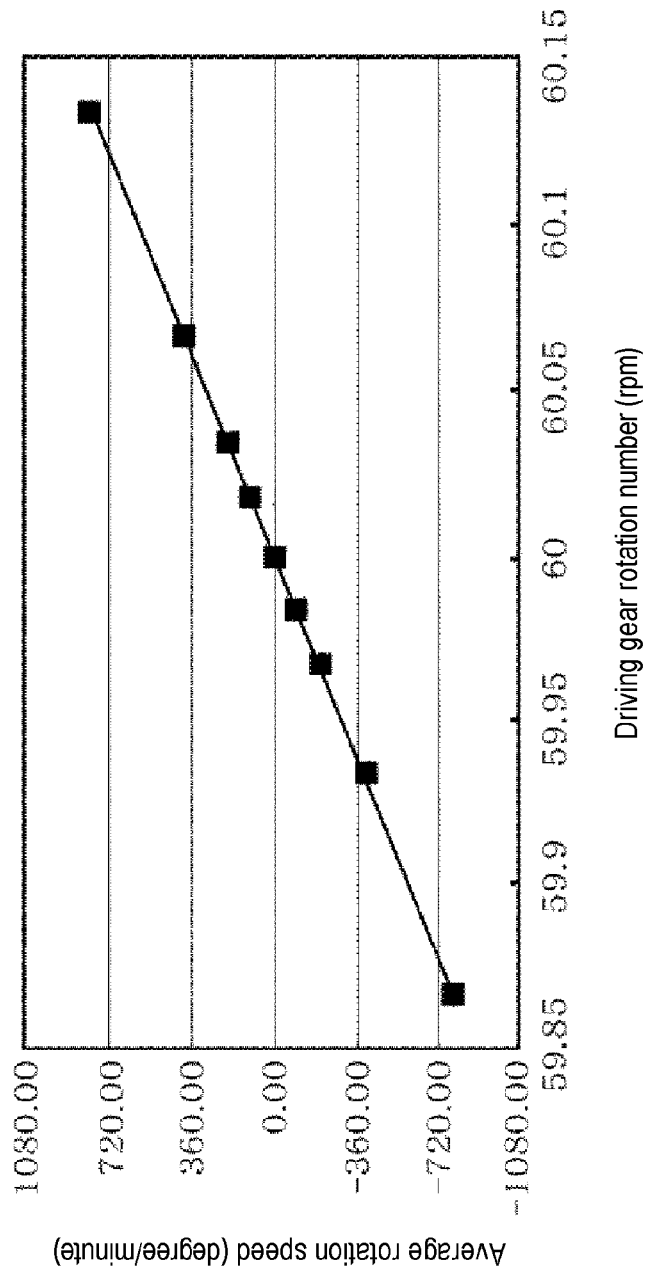
FIG. 16 is a characteristic graph showing the results of an evaluation test according to the present disclosure.
Figure 17:
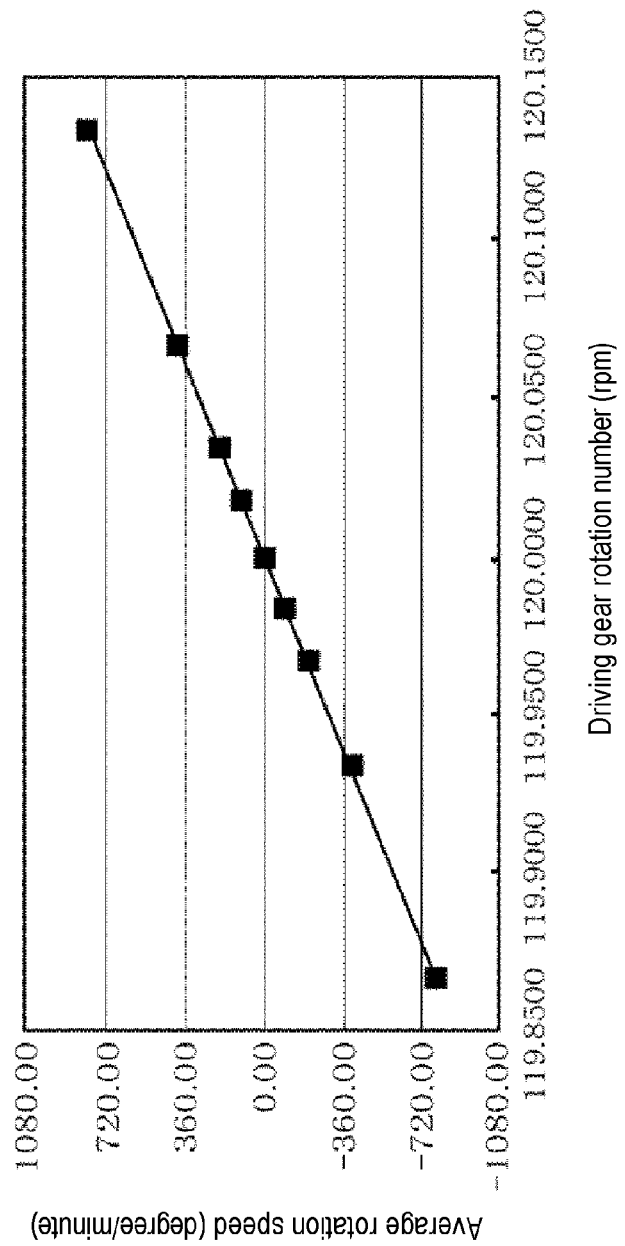
FIG. 17 is a characteristic graph showing the results of an evaluation test according to the present disclosure.

As for the measurement results, FIG. 15 shows the measurement result in the case where the number of rotations of the rotary table 2 is 30 rpm, FIG. 16 shows the measurement result in the case where the number of rotations is 60 rpm, and FIG. 17 shows the measurement result in the case where number of rotations is 120 rpm. In FIGS. 15 to 17, the horizontal axis represents the number of rotations (rpm) of the driving gear, and the vertical axis represents the average rotation speed (degree/minute) of five wafers W. Since the above-described rotation velocity difference is obtained by subtracting the number of rotations of the rotary table 2 from the number of rotations of the driving gear 5, it was recognized that the rotation velocity difference and the rotation speed of the driven gear 4 maintain a proportional relationship with each other. Even when the number of rotations of the rotary table 2 is changed to 30 rpm, 60 rpm, and 120 rpm, it was confirmed that the rotation velocity difference and the rotation speed of the driven gear 4 are in the same proportional relationship. It was recognized that by using the rotation detection jig of the present disclosure, it is possible to accurately detect the rotation amounts (rotation angles) of five mounting stands 3.

According to the present disclosure, in order to detect the rotation amount of a mounting stand revolved by the rotation of a rotary table and rotated on its own axis, a rotating element is provided so as to rotate about a rotation axis of the mounting stand, and the rotation angle of the rotating element is detected using an encoder main body that constitutes a rotary encoder together with the rotating element. Therefore, it is possible to accurately and easily detect the rotation amount of the mounting stand.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A rotation detection jig used for an apparatus in which a substrate is processed inside a processing container by rotating a mounting stand for a substrate provided on one surface side of a rotary table while revolving the mounting stand with rotation of the rotary table, and supplying a processing gas to a region through which the mounting stand passes, the jig comprising:
the rotary table including the mounting stand for a substrate, and configured to rotate about a first rotation shaft connected to a central portion of the rotary table;
a rotary encoder comprising:
a rotating element including a resonance coil, attached to the mounting stand to be aligned with a rotation center of a second rotation shaft of the mounting stand, and configured to rotate about the second rotation shaft of the mounting stand; and
a rotation angle detector configured to detect a rotation angle of the rotating element;
a frame fixed to an outer side of the mounting stand in the rotary table to fix the rotation angle detector to a rotating portion including the rotary table and configured to support the rotation angle detector at a center portion of the frame above the rotating element; and
a controller provided in the rotating portion and configured to process a detection signal detected by the rotation angle detector.

2. The jig of claim 1, wherein the rotary table includes a plurality of mounting stands disposed along a circumferential direction of the rotary table, and
the rotary encoder is provided for each of the plurality of mounting stands.

3. The jig of claim 1, wherein the rotating element is disposed on one surface side of the rotary table.

4. The jig of claim 1, wherein the rotation angle detector is not in contact with the rotating element.

5. A substrate processing apparatus in which a substrate is processed inside a processing container by rotating a mounting stand for a substrate provided on one surface side of a rotary table while revolving the mounting stand with rotation of the rotary table, and supplying a processing gas to a region through which the mounting stand passes, the apparatus comprising:
the rotary table including the mounting stand for a substrate, and configured to rotate about a first rotation shaft connected to a central portion of the rotary table;
a second rotation shaft rotatably provided in a portion rotating together with the rotary table and configured to support the mounting stand;
a driven gear provided on the second rotation shaft;

a driving gear provided so as to face a revolution trajectory of the driven gear and configured to constitute a magnetic gear mechanism together with the driven gear;
a rotary encoder comprising:
- a rotating element including a resonance coil, attached to the mounting stand to be aligned with a rotation center of the second rotation shaft of the mounting stand, and configured to rotate about the second rotation shaft of the mounting stand; and
- a rotation angle detector configured to detect a rotation angle of the rotating element;

a frame fixed to an outer side of the mounting stand in the rotary table to fix the rotation angle detector to a rotating portion including the rotary table and configured to support the rotation angle detector at a center portion of the frame above the rotating element; and a controller provided in the rotating portion and configured to process a detection signal detected by the rotation angle detector.

6. The apparatus of claim 5, wherein the driven gear includes N-pole portions and S-pole portions alternately arranged along a rotational direction, the driving gear includes N-pole portions and S-pole portions alternately arranged over the entire circumference along the revolution trajectory, and the apparatus further comprises a rotation motor configured to rotate the driving gear.

7. The apparatus of claim 5, wherein the mounting stand includes a plurality of mounting stands provided along a circumferential direction of the rotary table, and the rotary encoder is provided for each of the plurality of mounting stands.

* * * * *